United States Patent
Machnicki

(10) Patent No.: US 9,643,346 B2
(45) Date of Patent: May 9, 2017

(54) METHOD AND DEVICE FOR PRODUCING A SEAMLESS CIRCUMFERENTIALLY CLOSED FLEXIBLE EMBOSSING TAPE AND EMBOSSING TAPE

(75) Inventor: Andrew Machnicki, Hamburg (DE)

(73) Assignee: MACHOVIA TECHNOLOGY INNOVATIONS UG (DE)

(*) Notice: Subject to any disclaimer, the term of this patent is extended or adjusted under 35 U.S.C. 154(b) by 0 days.

(21) Appl. No.: 14/344,134

(22) PCT Filed: Sep. 14, 2012

(86) PCT No.: PCT/GB2012/052285
§ 371 (c)(1),
(2), (4) Date: Apr. 14, 2014

(87) PCT Pub. No.: WO2013/038205
PCT Pub. Date: Mar. 21, 2013

(65) Prior Publication Data
US 2014/0212529 A1    Jul. 31, 2014

(30) Foreign Application Priority Data

Sep. 14, 2011 (DE) .................. 10 2011 082 714

(51) Int. Cl.
| B29C 35/02 | (2006.01) |
| B29C 39/26 | (2006.01) |
| B29C 39/02 | (2006.01) |
| B29C 39/36 | (2006.01) |
| B29C 35/08 | (2006.01) |

(52) U.S. Cl.
CPC ............ *B29C 39/26* (2013.01); *B29C 39/026* (2013.01); *B29C 39/028* (2013.01); *B29C 39/36* (2013.01); *B29C 35/02* (2013.01); *B29C 35/0888* (2013.01); *B29C 2035/0827* (2013.01)

(58) Field of Classification Search
CPC ..... B29C 35/02; B29C 35/0888; B29C 39/26; B29C 39/36; B29C 39/028; B29C 39/026
USPC ....... 425/392, 393, 435, 440, 441, 447, 448, 425/451.9
See application file for complete search history.

(56) References Cited

U.S. PATENT DOCUMENTS

| 3,200,180 A | 8/1965 | Russ et al. |
| 3,200,442 A * | 8/1965 | Haller .................. B30B 11/001 |
| | | 425/393 |
| 3,429,005 A * | 2/1969 | MacMillan ........ B29D 30/0603 |
| | | 425/170 |

(Continued)

FOREIGN PATENT DOCUMENTS

| CN | 1204982 A | 1/1999 |
| CN | 101627428 A | 1/2010 |

(Continued)

*Primary Examiner* — Joseph S. Del Sole
*Assistant Examiner* — Thukhanh T Nguyen
(74) *Attorney, Agent, or Firm* — King & Schickli, PLLC

(57) ABSTRACT

Disclosed is a method for producing substantially seamless, circumferentially closed flexible embossing or printing tapes (2), wherein a free-flow material is fed into an annular mold space (14) defining the profile of the tape (2), said mold (1) comprising an external sidewall (6), delimiting the external radial extent of an annular space (14), and a core (12), delimiting the internal radial extent of the annular space (14). A device for carrying out such a method is also disclosed.

16 Claims, 9 Drawing Sheets

(56) References Cited

U.S. PATENT DOCUMENTS

| | | | |
|---|---|---|---|
| 3,619,446 A | 11/1971 | Nauta | |
| 3,865,526 A * | 2/1975 | Drostholm | B29C 53/74 |
| | | | 425/457 |
| 4,113,813 A * | 9/1978 | Wilson | B29B 13/025 |
| | | | 425/393 |
| 5,658,515 A | 8/1997 | Lee et al. | |
| 5,833,898 A | 11/1998 | Dutt | |

FOREIGN PATENT DOCUMENTS

| | | |
|---|---|---|
| GB | 1263272 A | 2/1972 |
| WO | 0006396 A2 | 2/2000 |
| WO | 2006078918 A2 | 7/2006 |
| WO | 2007001977 A2 | 1/2007 |
| WO | 2007100849 A2 | 9/2007 |
| WO | 2008024947 A2 | 2/2008 |
| WO | 2008046938 A1 | 4/2008 |

* cited by examiner

METHOD AND DEVICE FOR PRODUCING A SEAMLESS CIRCUMFERENTIALLY CLOSED FLEXIBLE EMBOSSING TAPE AND EMBOSSING TAPE

FIELD OF THE INVENTION

The invention relates to a method and a device for the manufacture of substantially seamless, flexible circumferentially closed embossing or printing tapes, as well as an embossing tape.

BACKGROUND OF THE INVENTION

The term "printing or embossing tape" as referred to herein will be understood to mean a tape having a surface structure formed on its surface for printing or embossing. Such surface structure may for example be a micro or nano scale structure.

For embossing or printing a replication/transfer tool having microsurface or nanosurface structures may typically be formed on a rigid surface such as a cylinder, with the structures having a negative imprint of the desired final pattern. The pattern is then used to either transfer an ink or to replicate a structure on a substrate. For example, WO2008/024947A2 discloses a method and apparatus for fabricating durable replication tools.

There is a desire to provide such surface structures on a flexible tape which may then be mounted on rollers to print or emboss a surface, particularly if said surface is non-planar, irregular or flexible such that printing or embossing with a rigid cylinder may be difficult.

Thus, an object of embodiments of the invention is to create a method and a device for the manufacture, substantially seamless, circumferentially closed flexible embossing or printing tapes. Furthermore, it is an object of embodiments of the invention to create a substantially seamless, circumferentially closed flexible embossing or printing tape.

The term "substantially seamless" as referred to herein will be understood to mean a tape which is manufactured in a single step without the need for a separate joining process. Substantially seamless tapes may include both tapes which are entirely seamless (i.e. no discontinuity is detectable or visible) and tapes which have a limited discontinuity (for example as a result of a joint in the mould with which the tape is formed) It will be appreciated that an embossing or printing tape as referred to herein may alternatively be referred to in the art as a belt, form or tool.

SUMMARY OF THE INVENTION

According to a first aspect of the invention there is provided, a method for the manufacture of substantially seamless, circumferentially closed flexible embossing or printing tapes, comprising the steps:
  providing a mould space defining the profile of the tape, said mould comprising an external sidewall, delimiting the external radial extent of an annular space, and a core, delimiting the internal radial extent of the annular space;
  face-end introduction of a free-flow material into the annular space;
  curing of the free-flow material; and
  demoulding of the cured material.

The external side wall may comprise a plurality of side elements. The step of demoulding may comprises the steps of: outwardly radially displacing the side elements away from the core to open said annular space; and removing the tape from the core.

The step of providing a negative mould may further comprise the step of: providing an insert mould onto one of the walls delimiting the annular space, the insert mould defining a surface relief pattern to be formed on the tape. The insert mould may be provided as a circumferential sleeve around the core. In some arrangements an insert mould may be provided on both walls of the annular space (one or both of which may be provided with a surface relief pattern).

The free-flow material may be introduced, sucked into or injected into the annular space by means of capillary action. The free flow material may, for example, be drawn into the annular space under a vacuum.

The free-flow material may be cured by means of light radiation, such as UV, or heat radiation. Alternatively, the free flow material may be cured by a chemical reaction. For example, the free flow material may be mixed with a curing agent before or during flow into the annular space. The free flow material may be a silicon polymer.

At least one body surface may be textured, in that the free-flow material is conducted past an insert mould of the texture to be depicted.

According to a further aspect of the invention there is provided, a device for producing seamless, circumferentially closed flexible embossing or printing tapes, the device comprising:
  a multi-part housing comprising a side wall for delimiting the radially external extent of an annular space, a bottom wall and a lid wall for delimiting the respective face-ends of the annular space;
  a core for the radially internal delimiting of the annular space;
  an inlet for introducing a free-flow material; and
  a vent for ventilating the annular space.

The inlet may be formed on the bottom wall side and may, for example, comprise a plurality of inlet openings, which in the assembled state lead into the annular space at the face end.

The vent may be provided on the lid wall side and may, for example, comprise a plurality of outlet openings, which in the assembled state extend out of the annular space at the face end.

A vacuum pump may be provided for connection to the vent for evacuating the annular space.

The side wall may be designed in multiple parts with a plurality of side elements. The side elements may comprise a plurality of circumferential segments. The side elements may be are arranged so as to be outwardly radially displaceable to enable the annular space to be opened. It is advantageous to be able to open the annular space by radial movement of the side elements since there pressure, adhesion and or friction between the cured material and the side elements acts to strongly resist and sliding motion between the mould parts. Additionally, when moulding a tape having micro or nano structural features it may not be possible to utilise a release coat since it might fill features of the mould. In some embodiments of the invention, therefore, a release coat may be provided on only the blank or unstructured wall of the mould.

For example, the side elements may be outwardly rotatable. The side wall may comprise two halves joined at a fixed pivot (for example in a clamshell type arrangement). The halves may or may not be equal. A half may comprise a plurality of side elements. For example the side wall may comprise two halves each comprising two side elements.

Each adjacent side element in a single half may be pivotally engaged. Advantageously, this arrangement may enable a compound rotation of at least some of the segments (i.e. a rotation of the half about its fixed pivot and a rotation of the adjacent segment about the pivot between adjacent side elements) to maximise the space between the side wall and core in the open position. The adjacent side elements may be self-centring to each other. Adjacent side elements seen in circumferential direction may be arranged to make possible a mutual tolerance offset.

A seal may be provided between adjacent side elements. The seal may for example comprise an inflatable seal (which may be an inflatable elastomer seal).

An insert mould may be provided introducing a texture in a body surface. The insert mould will typically be a positive surface structured insert mould which creates a negative on the tool or tape (which in turn is used to create positive on the final substrate). The insert mould may be flexible. In the assembled state, the insert mould may close longitudinal gaps between the side elements or core. For example, the insert mould may cover discontinuities which could for example be the result of the joining of outer wall segments, magnets provided in the walls or moveable sections of the core.

The insert mould may be provided on either the side wall or the core. The insert mould may be a sheet or may be pre formed into a cylindrical insert. The insert mould may be magnetic and one of the side wall or the core may be provided with plurality of magnets. For example the insert mould may be formed of a metallic sheet, for example a nickel alloy sheet.

The core may have multiple parts. Alternatively, or additionally, the core may be provided with an expandable diameter. For example the core may be mechanically or pneumatically expandable. The core may comprise at least one circumferential segment which is radially displaceable. The core may comprise a plurality of displaceable segments, for example opposing segments. The plurality of segments may be arranged to expand equally to provide an even change of diameter across the core. The core may be radiation-permeable, for example to UV-radiation. The device may further comprise a curing device, such as a UV-radiation source or a heater. The curing device may be positioned in the core.

The invention includes an embossing or printing tape produced according to a method according to an embodiment of invention or with a device according to an embodiment of the invention.

Whilst the invention has been described above, it extends to any inventive combination set out above or in the following description and drawings.

BRIEF DESCRIPTION OF THE DRAWINGS

In the following, preferred exemplary embodiments of the invention are explained in more detail by means of schematic representations, in which:

FIG. 3 is a horizontal section through the casting mould of FIG. 1;

FIG. 4 is a detail from FIG. 3;

FIG. 9 is a bottom wall of the casting mould;

FIG. 10 is a lid wall of the casting mould;

DETAILED DESCRIPTION OF EMBODIMENTS

Figure 1:
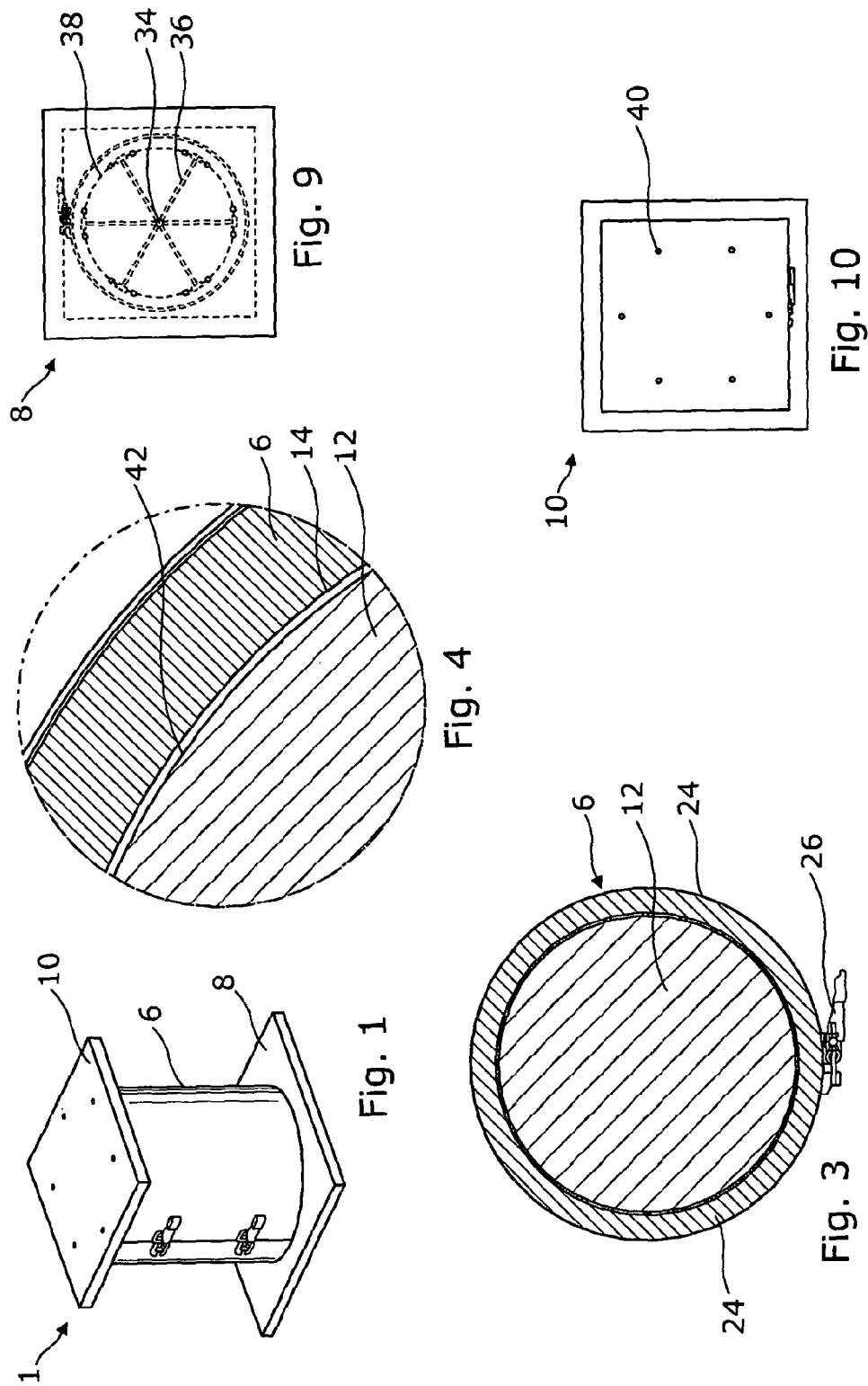
FIG. 1 is a perspective representation of a casting mould of a device according to an embodiment of the invention.
Figure 2:
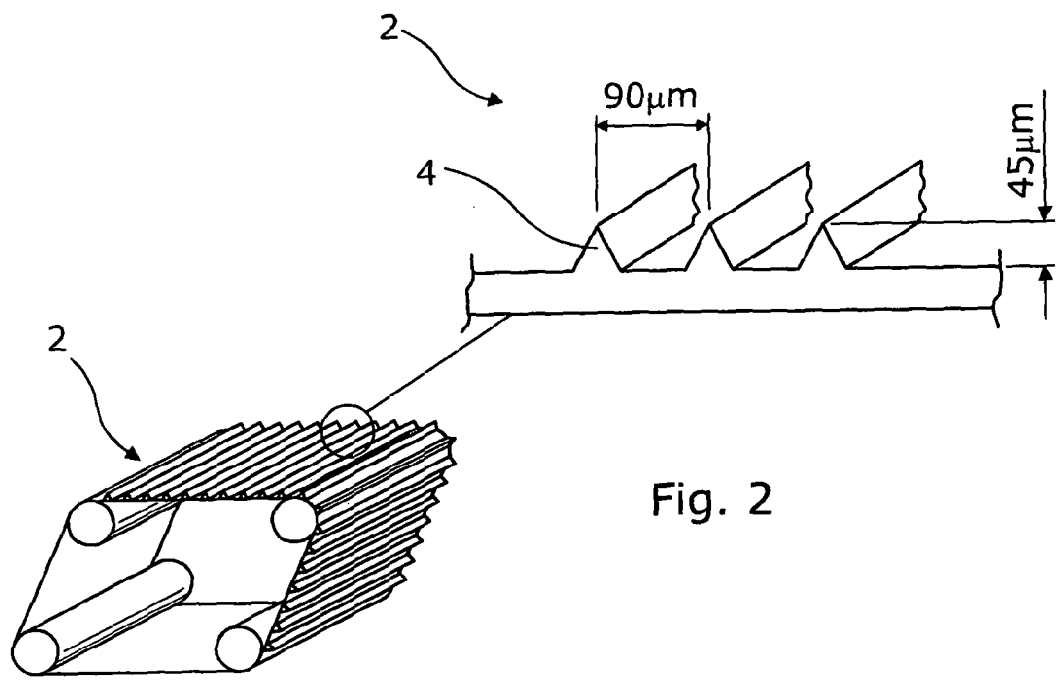
FIG. 2 is an embossing tape according to an embodiment of invention.

FIG. 1 shows a casting mould 1 of a device according to an embodiment the invention for producing an embossing tape 2 shown in FIG. 2. The embossing tape 2 is a seamless circumferentially closed flexible body with an external texture. In use, the embossing tape 2 rotates for example about rollers and is simultaneously moved over a surface to be embossed so that a counter-texture of the texture is depicted in the surface. The texture has for example a plurality of tooth-like elevations 4 arranged in transverse direction. The overall thickness of the embossing tape 2 is for example 3 mm. The elevations 4 per se are for example 45 μm high and spaced from one another at a spacing of 90 μm.

As shown in the FIGS. 1, 3 and 4, the casting mould 1 has a multi-part housing with a side wall 6, a bottom wall 8, a lid wall 10 and a core 12. The core 12 is arranged in the housing and with the side wall 6 delimits an annular space 14. The annular space 14 serves for the receiving of a free-flow product for forming the embossing tape 2. At the face end, the annular space 14 is delimited by the floor wall 8 and by the lid wall 10.

Figure 5:
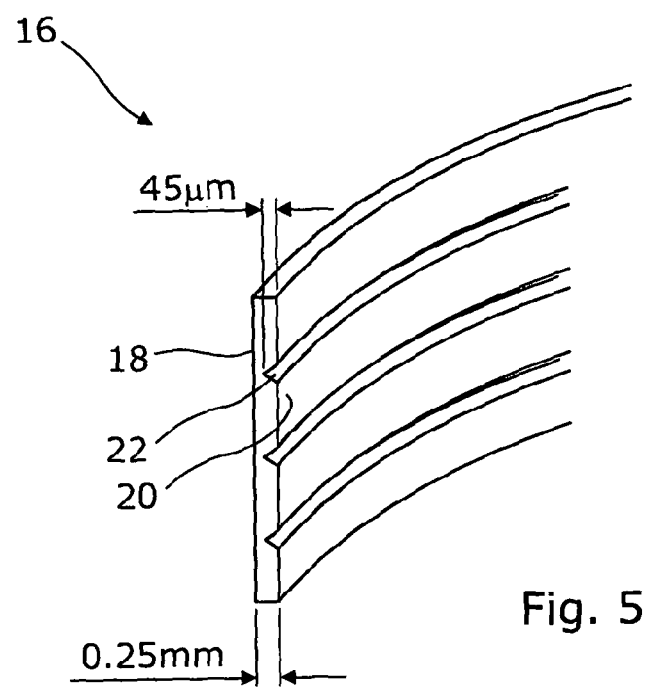
FIG. 5 is a section of a insert mould of the device.
Figure 6:
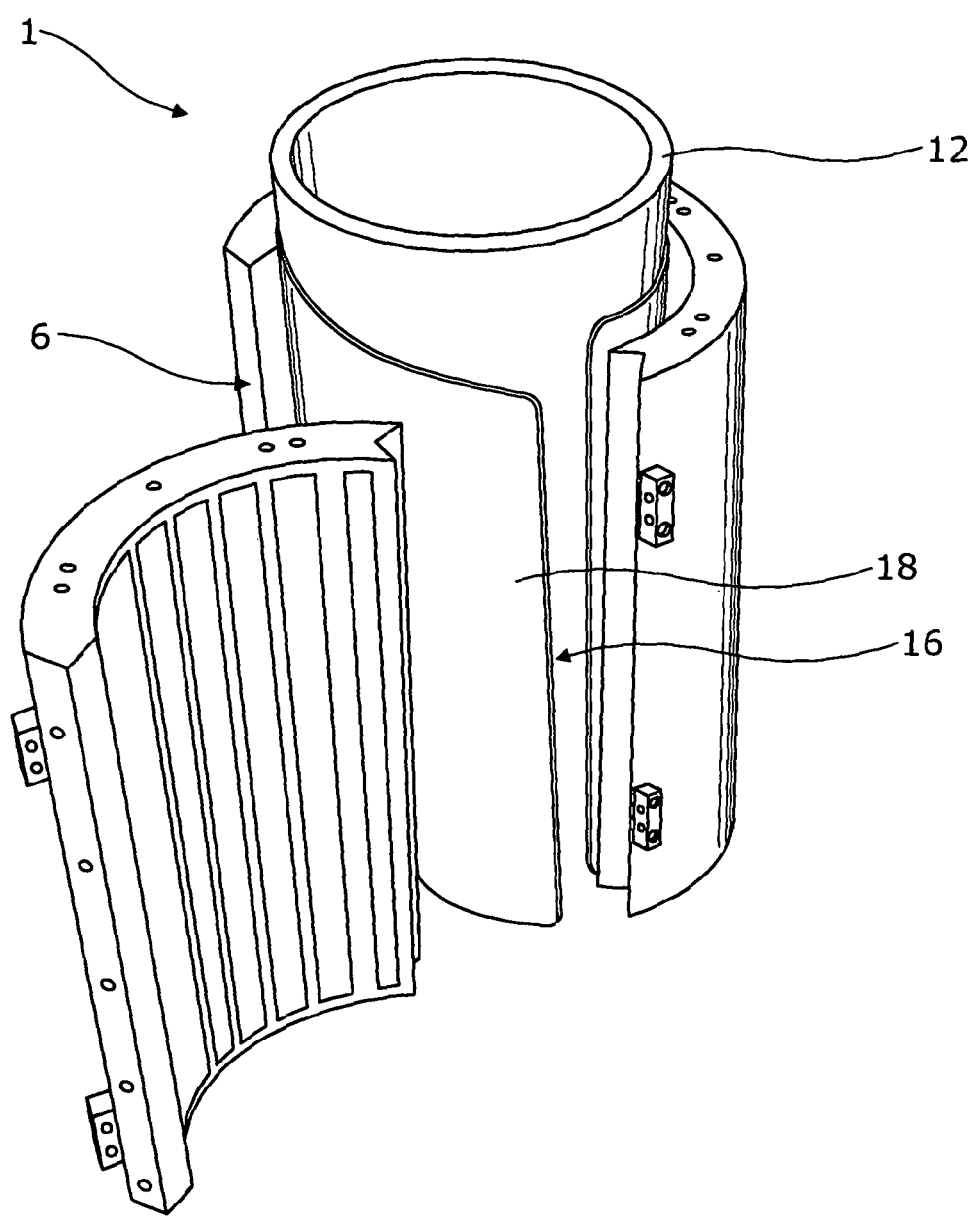
FIG. 6 is a positioning of the insert mould in the casting mould.

For introducing the external texture in the embossing tape 2 the casting mould has an insert mould 16 having a textured or partially textured surface as shown in sections in FIG. 5. The insert mould 16 is magnetic and flexibly designed in such a manner that it can be rolled about the vertical axis of the casting mould 1. It is more preferably sheet-metal like. It has an elevation-free external surface 18 and a textured internal surface 20, in which depressions 22 are formed in such a manner that the elevations 4 are formed as positive (or negative) moulds. As shown in FIG. 6, the insert mould 16 with its external surface 18 in the assembled state is in contact with the side wall 6 and thus delimits the annular space 14 radially outside. The insert mould 16 has for example a wall thickness of 0.25 mm. The depressions 22 have an extension corresponding to the elevations 4 and thus a depth of 45 μm in the shown exemplary embodiment. Its lateral spacing is in accordance with the lateral spacing of the elevations 4 and thus 90 μm. The orientation of the depressions 22 and their shape depends on the texture to be depicted. For arrangement in the annular space 14, the latter has a radial extension corresponding to the sum of the insert mould 16 and the overall thickness of the embossing tape 2. In the shown exemplary embodiment the annular space 14 thus has a width of 3.25 mm prior to the insertion of the insert mould 16. Following the insertion, the annular space 14 has a width of 3 mm and thus a width corresponding to the embossing tape 2.

Figure 7:
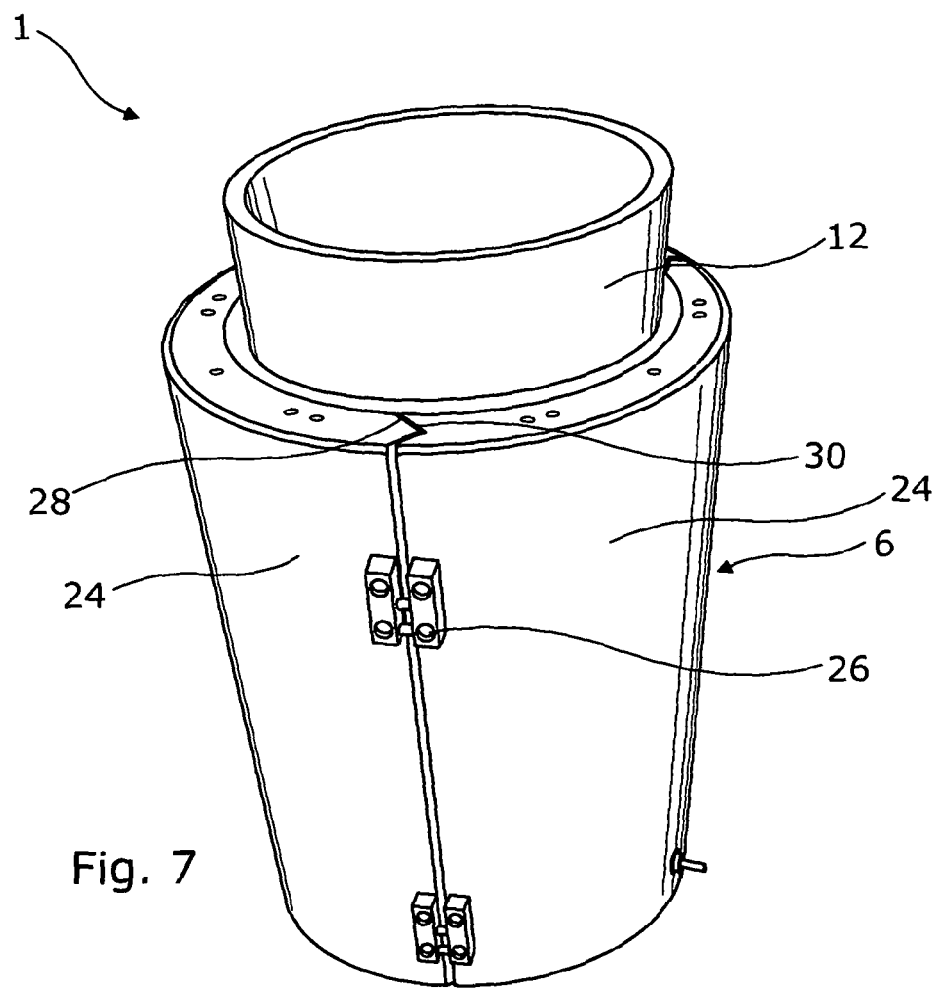
FIG. 7 is a lateral view of the casting mould.
Figure 8:
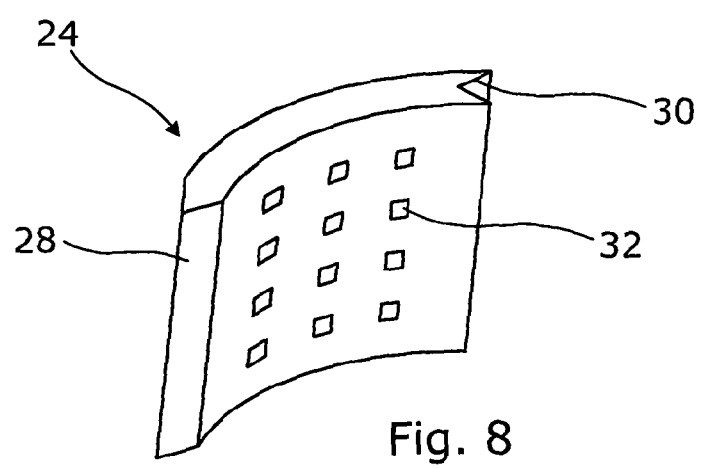
FIG. 8 is a side element of a side wall.

As already shown in FIG. 3 and numbered as in FIG. 7, the side wall 6 is designed in multiple parts with at least two side elements 24. At their longitudinal sides, the side elements 24 can be releasably connected to one another via closure elements. In particular, the closure elements 26 make possible a mutual tolerance offset in circumferential direction of the side elements 24. For the self-centring of the side elements 24, their longitudinal sides can be provided with a V-protrusion 28 or with a V-groove 30 for receiving the respective V-protrusion 28. According to the representation in FIG. 8, a plurality of magnets 32 is arranged in the side elements 24 for the temporary fixing of the insert mould 16, which can be embodied both as permanent magnets as well as electromagnets. Alternatively or additionally magnets may be provided on the wall core support cylinder such that an insert mould may be provided on either or both of the radial surfaces of the annular mould space.

As shown in FIG. 9, the bottom wall 8 has an annular standing surface for the positioning of the side wall 6. In addition, it comprises an integrated inlet for introducing the free-flow material. The inlet has a central bore 34, radial channels 36 and an inlet opening ring 38. The channels 36 extend between the bore 34 and the inlet opening ring 38, which in the assembled state is arranged on the face end of the annular space 14 and which has a plurality of inlet openings.

The lid wall 10, as shown in FIG. 10, has a vent with a plurality of annularly arranged outlet openings 40, which are arranged in such a manner that in the assembled state these are located at the face end of the annular space 14 so that the latter can be ventilated. The vent can lead into the outside surroundings so that the annular space 14 is pressure-relieved or can be connected for example with a vacuum pump of the device for subjecting the annular space 14 to a vacuum.

The core 12 is a cylindrical body having an elevation-free circumferential surface 42 (see FIG. 4). It can consist of a translucent material, more preferably a UV-permeable material. In particular, it is not magnetic. For simplifying a demoulding the core 12 can be designed in multiple parts.

For curing the free-flow material a curing device such as a UV-radiation source or a heater can be integrated in the casting mould 1. The UV-radiation source is more preferably positioned in the casting mould 1 in the core 12.

In the following, a preferred method for the manufacture of the embossing tape 2 shown in FIG. 2 is explained. The casting mould 1 is assembled, wherein the insert mould 16 is fixed on the side elements 24 by means of the magnets in such a manner that their structural internal surface 20 delimits the annular space 14 radially outside. Longitudinal gaps between the side elements 24 are covered by the insert mould 24, thus closing these. Radially inside, the annular space 14 is delimited by the circumferential surface of the core 12. The vent is connected to a vacuum pump and the annular space 14 is evacuated. Following the evacuation, the inlet tied to an inflow device is opened and the free-flow material is sucked into the annular space 14 at the face end via the inlet openings on the bottom. The free-flow material is sucked in the direction of the lid-sided vent until the annular space 14 is completely filled with the free-flow material. In the process, it enters into the depressions 22. After the filling, the material starts to cure. This can take place automatically, for example by using a material on two-component bases or with the help of the curing device. Following the curing, the casting mould 1 is disassembled and the embossing tape 2 demoulded. Externally, the embossing tape 2 is now provided with a texture having a plurality of elevations 4.

Obviously, the device can also be used for introducing a texture in the embossing tape 2 on the inside. To this end, the insert mould is fixed about the core 12. For example, this can also take place through magnetism, but in suitable magnets will then have to be integrated in the core 12. Alternatively, the embossing tape 2 following the demoulding can be turned or inverted such that the texture is arranged on the inside. Obviously, the embossing tape 2 can also be provided with a texture each on the inside and outside.

It is also noteworthy that the free-flow material can also be injected into the annular space 14 or flow into the annular space 14 by means of capillary action.

A casting mould 101 according to an alternate embodiment is shown in FIGS. 11-14. In this embodiment the mould 101 is provided on a support table 103. The mould comprises a core 112 which is generally held in a fixed position on the table 103. The core may be metallic and may in some cases be provided with magnets for retaining an insert mould (this embodiment is generally intended for use in moulding an internal texture, although the skilled person will appreciate that this can easily be reversed).

Figure 11:
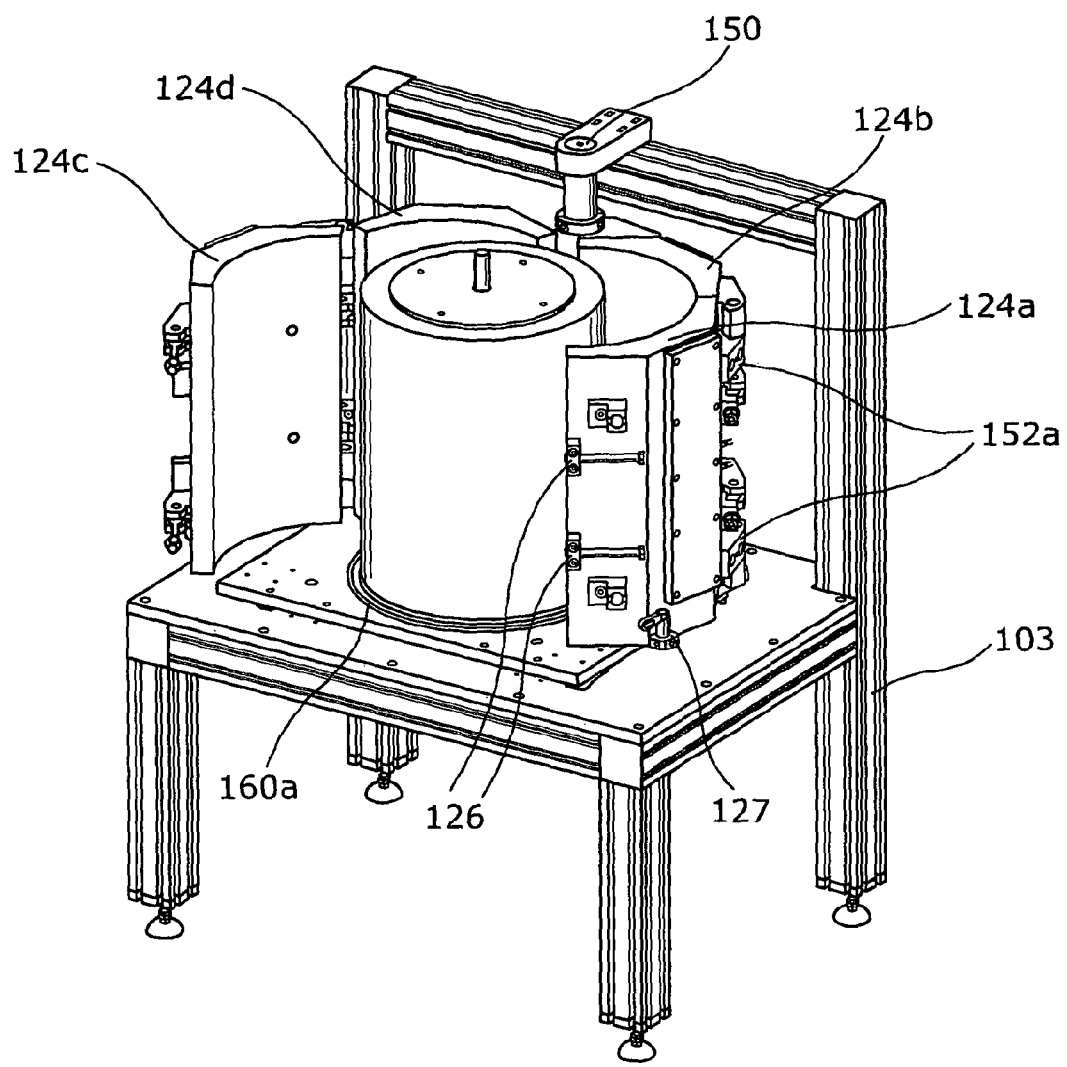
FIG. 11 is a 3-dimensional view of a casting mould of a device according to an alternate embodiment of the invention.
Figure 12:
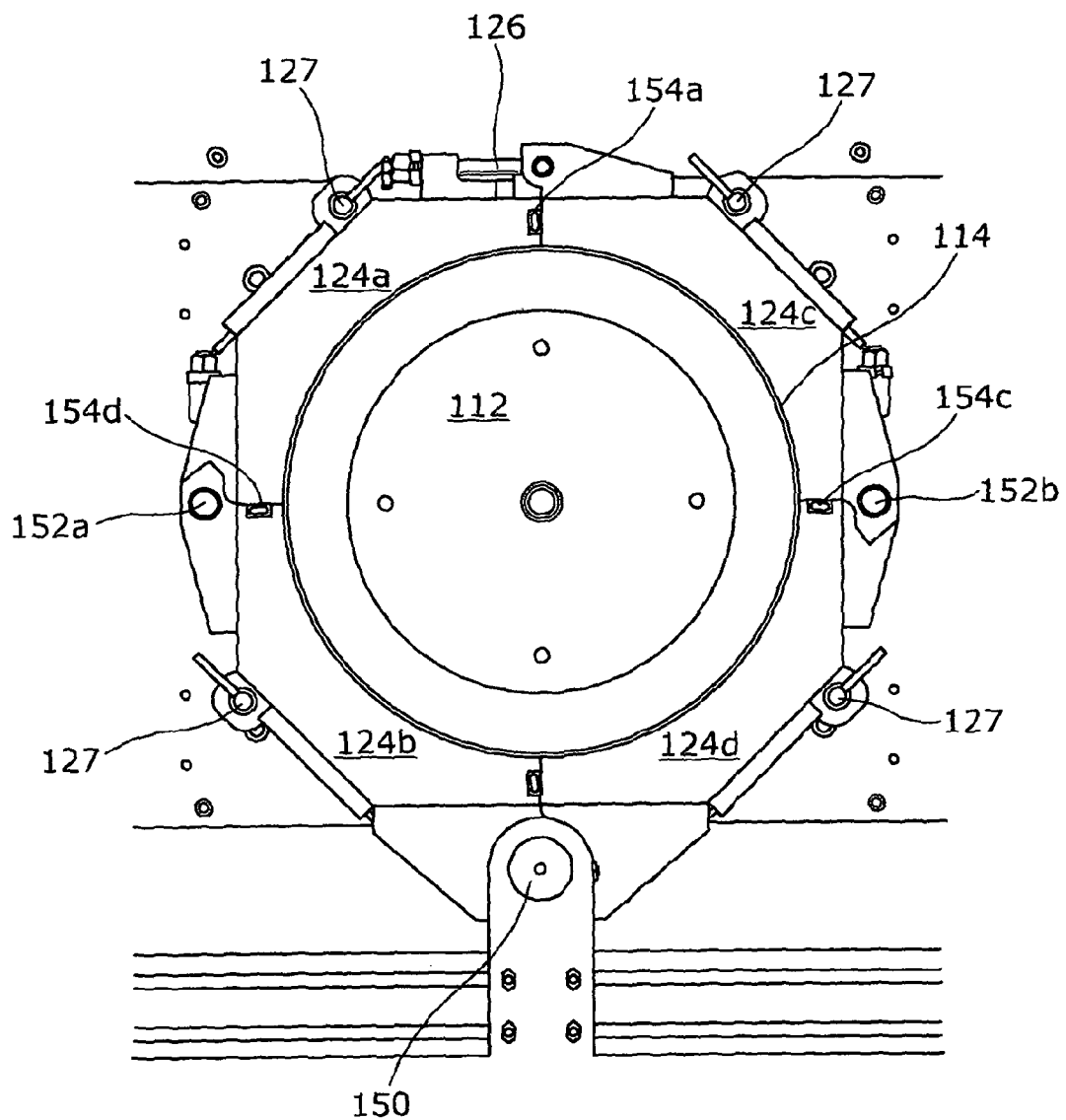
FIG. 12 is a partial plan view of the mould of FIG. 11 with the exterior wall in an open position.
Figure 13:
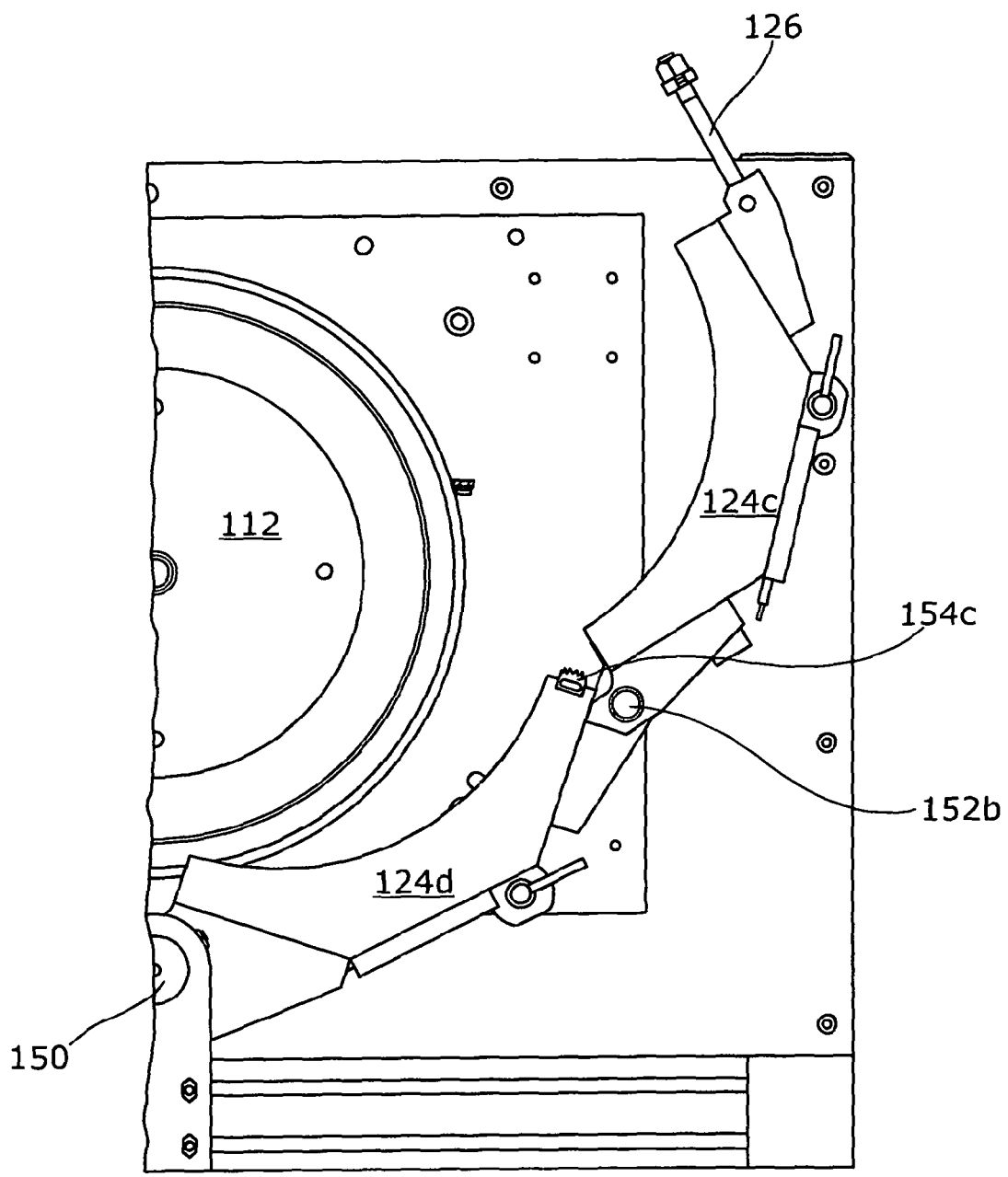
FIG. 13 is a plan view of the mould of FIG. 11 with the exterior wall in a closed position.

In this embodiment, the side wall 116 comprises four side elements 124a, 124b, 124c, 124d. Each element is formed of a quarter circumference segment. A fixed pivot shaft 150 is provided at the rear of the table 103 to which the adjacent, rear, side elements 124b, 124d are attached. The remaining, front, side elements 124a, 124c are pivotally attached to the rear side elements 124b, 124d by hinges 152a and 152b respectively. As such the side elements pairs 124a, 124b and 124c, 124d form a clamshell arrangement rotatable about the pivot 150 between an open position (as shown in FIGS. 11 and 13) and a closed position (as shown in FIG. 12). Additionally the front side elements 124a, 124c are able to rotate relative to the respective rear side elements 124b, 124d about the hinges 152a, 152b. As such it will be noted that the front doors may be rotated radially outward in a compound motion so as to maximise the opening of the annular space. Bolts 127 and closure elements 124 are provided for clamping the side elements in the closed position so as to define the annular space between the outer surface of the core 112 and the inner surface of the elements 124.

Figure 14:
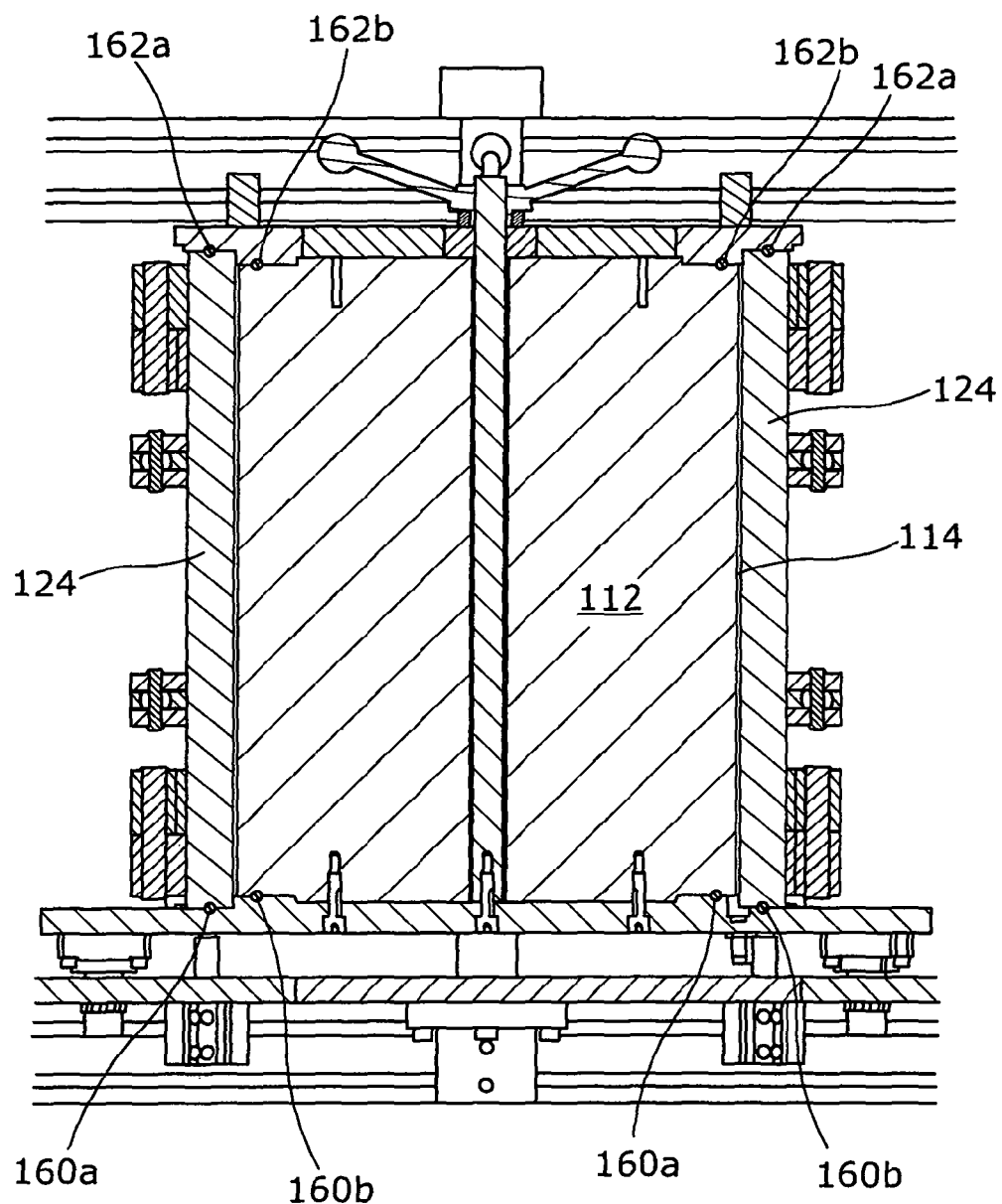
FIG. 14 is a cross section of the assembled mould of FIG. 11.

The hinges 150, 154a, 154b between adjacent side elements 124 are provided radially outside of the side wall and the adjacent side elements have sealing surfaces which are arranged to provide a flush mating surfaces. One of the adjacent sealing surfaces may be provided with a resilient seal 154 (which may be held in a recessed seal seat). It is particularly important that a strong seal is formed between the surfaces when vacuum forming a flexible tape since any ingress of air from outside of the casting mould may result in bubbles, voids or other imperfections in the tape. As such, elastomer inflatable seals are preferably provided between the side elements. One such commercially available seal which would be suitable for use in embodiments of the invention is the Cefilair® range of pneumatic seals from Garlock Sealing Technologies. As shown in FIG. 14, O-ring seals are preferred for sealing between the bottom wall 108 and lid 110. A pair of O-rings 160a, 160b and 162a, 162b are provided respectively at both the bottom wall 108 and the lid 110 so as to seal either side of the annular space 114.

Figure 15:
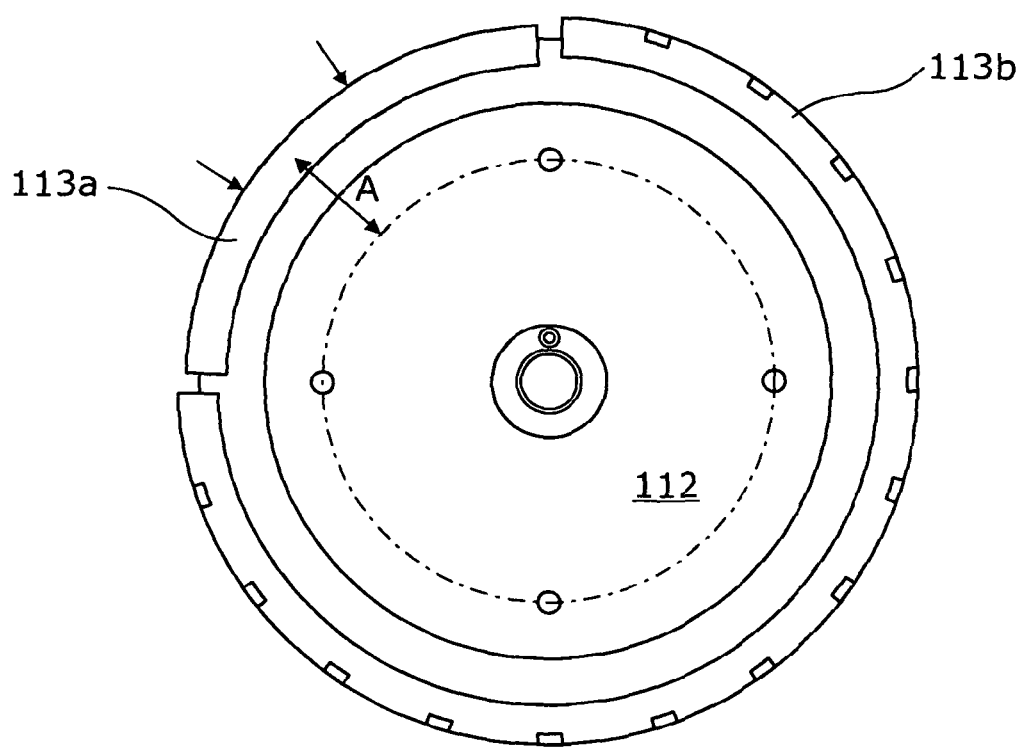
FIG. 15 is an expandable core for use in embodiments of the invention.

While an inset mould may be provided as a sheet 16 (for example a nickel shim) as described above it may be desirable to use a nickel shim which has been formed into a cylindrical sleeve. For example, the insert mould 16 may be formed from as a sleeve by rolling and welding the ends. An advantage of such sheets is that any discontinuities which would form a seam effect in the final tape may be further reduced. However, in order to keep its shape and dimensions such cylindrical sleeve inserts must be fixed very precisely to the core. As such, an expandable core 112 as shown in FIG. 15, may be provided. The expandable core is provided with at least one circumferential section 113a which is radially moveable between a retracted and expanded position (in the direction shown by arrow A). In some embodiments multiple sections, for example opposing sections, may be radially expandable. For example four expandable sections may be provided, in radially opposing pairs. In order to maintain the shape tolerance of the annular mould space 114 the segments should be arranged to expand equally. To provide for accurate fixing of the mould to the core 112 a further portion 113b of the circumference of the core 112 is fixed. The expandable section of the core provides sufficient clearance in its retracted position to enable a sleeve to be slid over the core. Once in position pneumatic air is pumped into the core to radially expand portion 113a and retain the insert mould sleeve in position.

Although the invention has been described above with reference to one or more preferred embodiments, it will be appreciated that various changes or modifications may be made without departing from the scope of the invention as defined in the appended claims.

It will be appreciated that the printing or embossing belt of the invention may be utilised in, for example: UV Casting/UV Embossing of nano and microstructures on to rigid or flexible substrates, for Optical and function surfaces; in the printing (print and coating) industry as a means of transferring inks or coatings from the flexible form/matrix to a flexible or rigid substrate similar to roller or plate related print technologies (and in particular for flexo-graphic, roto-gravure, off set and digital off set) or where the ink is first transferred to the flexible belt (in place of a conventional roller) and then printed on to or transferred on to the intended substrate material; Printed electronics, utilising the same technologies as printing but with the use of metallic or conductive inks and coatings.

The skilled person will appreciate that in some embodiments the insert mould may not be required and rather the detailed surface structure may be formed directly upon the surface of the core or external wall defining the annular space. In particular, such an arrangement may be preferred where there is a need for the final tape to be entirely seamless (particularly if the tolerance is to the micro or nano scale) since an insert sleeve will typically provide seam effects where the ends of the insert are overlapped or joined. However, this significantly increases the cost of replacing the mould (for example if it is damaged or if it needs to be modified) and as such insert moulds are generally preferred in the embodiments of the invention described above.

Flexible belts in accordance with embodiments of the invention are typically formed from silicone polymers, for example PolyDimethylsiloxane (PDMS). It will be appreciated that Silicone polymers have a backbone of alternating silicon and oxygen atoms, that is they are polysiloxanes. The simplest Simplest is polydimethyl siloxane (side groups from Silicon of two methyls) but is a liquid and is formed as a solid using, for example, cross bridges. Silicone resins have many such branched structures.

Such polymers may typically be used in a two part formulation of a highly viscous liquid silicone elastomer and curing agent. However, the skilled person will appreciate that other polymers may be used without departing from the scope of the invention, for example PET, PMMA, PVC. The material chosen will generally depend upon the particular application (for example, the required thickness of the tape or the required wear resistance).

The invention claimed is:

1. A device for producing substantially seamless, circumferentially closed flexible embossing or printing tape having a micro or nano scale surface structure, the device comprising:
   a multi-part housing comprising a side wall delimiting a radially external surface of an annular mould space, a bottom wall and a lid wall delimiting the respective face-ends of the annular space;
   a core, delimiting a radially internal surface of the annular space;
   an inlet for introducing a free-flow material; and
   a vent for ventilating the annular space;
   wherein the side wall comprises multiple parts with a plurality of outwardly displaceable side elements configured for outwardly radial displacement to enable the annular space to be opened in use; and
   wherein at least one of the radially internal or external surfaces of the annular space includes a texture surface defining a micro or nano scale surface structure corresponding to the micro or nano scale surface structure to be formed on a surface of the circumferentially closed flexible embossing or printing tape.

2. The device according to claim 1, wherein the plurality of side elements comprises a plurality of circumferential segments.

3. The device according to claim 1, wherein the plurality of side wall comprises two halves joined at a fixed pivot.

4. The device according to claim 3, wherein a half comprises a plurality of side elements.

5. The device according to claim 4, wherein adjacent side elements of the half are pivotably engaged.

6. The device according to claim 1, wherein adjacent side elements are self-centring to each other.

7. The device according to claim 1, wherein adjacent side elements seen in circumferential direction make possible a mutual tolerance offset.

8. The device according to claim 1, wherein a seal is provided between adjacent side elements.

9. The device according to claim 8, wherein the seal comprises an inflatable seal.

10. The device according to claim 1, wherein an insert mould is provided for introducing a texture in a body surface.

11. The device according to claim 10, wherein the insert mould is flexible and in the assembled state closes longitudinal gaps between the side elements.

12. The device according to claim 10, wherein the insert mould is magnetic and at least one of the side wall or core is provided with a plurality of magnets to retain the insert mould.

13. The device according to claim 1, wherein the core is of multiple parts.

14. The device according to claim 1, wherein the core has an expandable diameter.

15. The device according to claim 14, wherein the core comprises at least one circumferential segment which is radially displaceable.

16. The device according to claim 1, wherein the plurality of outwardly displaceable side elements are outwardly rotatable.

* * * * *